United States Patent
Javre et al.

(10) Patent No.: US 9,436,785 B1
(45) Date of Patent: Sep. 6, 2016

(54) HIERARCHICAL PRESET AND RULE BASED CONFIGURATION OF A SYSTEM-ON-CHIP

(71) Applicant: Xilinx, Inc., San Jose, CA (US)

(72) Inventors: Somdutt Javre, Seoni (IN); Pradeep Kumar Mishra, Hyderabad (IN); Siddharth Rele, Navi Mumbai (IN)

(73) Assignee: XILINX, INC., San Jose, CA (US)

( * ) Notice: Subject to any disclaimer, the term of this patent is extended or adjusted under 35 U.S.C. 154(b) by 63 days.

(21) Appl. No.: 14/491,656

(22) Filed: Sep. 19, 2014

(51) Int. Cl.
*G06F 17/50* (2006.01)

(52) U.S. Cl.
CPC ....... *G06F 17/5045* (2013.01); *G06F 2217/02* (2013.01); *G06F 2217/06* (2013.01)

(58) Field of Classification Search
CPC ............. G06F 17/5045; G06F 17/505; G06F 17/5068; G06F 17/5072; G06F 17/5077; G06F 17/5081
USPC ........ 716/100–107, 116–117; 326/37–41, 47
See application file for complete search history.

(56) References Cited

U.S. PATENT DOCUMENTS

| | | | | |
|---|---|---|---|---|
| 7,159,196 B2 * | 1/2007 | Anderson | ........... | G06F 17/5045 703/14 |
| 7,546,572 B1 * | 6/2009 | Ballagh | ............ | H03K 19/17732 716/138 |
| 8,327,309 B2 * | 12/2012 | Stuyt | .............. | G01R 31/318536 703/13 |
| 8,875,079 B2 * | 10/2014 | Saxon | ................. | G06F 17/5072 716/105 |

OTHER PUBLICATIONS

Xilinx, Inc., *Zynq-7000 All Programmable SoC: Concepts, Tools, and Techniques (CTT)*, UG873 (v14.7), Oct. 2, 2013, pp. 1-91, Xilinx, Inc., San Jose, California, USA.

Xilinx, Inc., *Zynq-7000 All Programmable SoC: Technical Reference Manual*, UG585 (v1.8), Sep. 16, 2014, Chapters 6 and 26, pp. 147-212 and pp. 688-696, Xilinx, Inc., San Jose, California, USA.

* cited by examiner

*Primary Examiner* — Nghia Doan

(74) *Attorney, Agent, or Firm* — Kevin T. Cuenot

(57) ABSTRACT

Hierarchical preset and rule base configuration of a system-on-chip (SOC) includes receiving a user input selecting a first circuit block of the SOC for enablement and determining, using a processor, a first top level preset according to the user input for the first circuit block. Selected intermediate presets are determined from a plurality of hierarchically ordered presets for the first circuit block. Low level presets are automatically determined for the first circuit block according to the selected intermediate presets for the first circuit block. The low level presets are output, e.g., by loading them into the SOC.

17 Claims, 11 Drawing Sheets

800

```xml
<?xml version="1.0" encoding="ISO-8859-1"?>
<!DOCTYPE parameters SYSTEM "presets.dtd" PUBLIC "presets">
<presets>
    <preset strength="4" name="1" param="alto_enet0_peripheral_enable">
        <set param="alto_enet0_enet0_io" value="MIO 16 .. 27"/>
        <set param="alto_enet0_peripheral_freqmhz" value="1000 Mbps"/>
        <set param="alto_EN_ENET0" value="1"/>
        <set param="alto_enet_reset_valid" value="1"/>
    </preset>
    <preset strength="7" name="0" param="alto_enet0_peripheral_enable">
        <set param="alto_enet0_peripheral_freqmhz" value="1000 Mbps"/>
        <disable param="alto_enet0_enet0_io"/>
        <disable param="alto_enet0_grp_MDIO_enable"/>
        <disable param="alto_enet0_peripheral_freqmhz"/>
    </preset>
    <preset strength="7" name="0" param="alto_enet0_grp_MDIO_enable">
        <disable param="alto_enet0_grp_MDIO_io"/>
    </preset>
    <preset strength="4 " name="1" param="alto_enet0_grp_MDIO_enable">
        <set param="alto_enet0_grp_MDIO_io" value="EMIO"/>
        <set param="alto_enet0_internal_mdio" value="1"/>
    </preset>
    <preset strength="6" name="EMIO" param="alto_enet0_enet0_io">
        <set param="alto_enet0_tx_clk_io" value="EMIO"/>
        <set param="alto_enet0_txd[3]_io" value="EMIO"/>
        <set param="alto_enet0_txd[2]_io" value="EMIO"/>
        <set param="alto_enet0_txd[1]_io" value="EMIO"/>
        <set param="alto_enet0_txd[0]_io" value="EMIO"/>
        <set param="alto_enet0_tx_ctl_io" value="EMIO"/>
        <set param="alto_enet0_rx_clk_io" value="EMIO"/>
        <set param="alto_enet0_rxd[3]_io" value="EMIO"/>
        <set param="alto_enet0_rxd[2]_io" value="EMIO"/>
        <set param="alto_enet0_rxd[1]_io" value="EMIO"/>
        <set param="alto_enet0_rxd[0]_io" value="EMIO"/>
        <set param="alto_enet0_rx_ctl_io" value="EMIO"/>
        <set param="alto_enet0_grp_MDIO_io" value="EMIO"/>
        <set param="alto_enet0_grp_MDIO_enable" value="1"/>
        <set param="alto_enet0_internal_eth_mode" value="0"/>
        <disable param="alto_enet0_grp_MDIO_enable"/>
        <disable param="alto_enet0_grp_MDIO_io"/>
        <set param="alto_EN_EMIO_ENET0" value="1"/>
        <set param="alto_enet0_peripheral_clksrc" value="External"/>
        <disable param="alto_enet0_peripheral_clksrc"/>
    </preset>
    <preset strength="5" name="MIO 16 .. 27" param="alto_enet0_enet0_io">
        <set param="alto_enet0_grp_MDIO_io" value="MIO 52 .. 53"/>
        <dischoice param="alto_enet0_grp_MDIO_io" value="EMIO"/>
        <set param="alto_enet0_tx_clk_io" value="MIO 16"/>
```

```
<set param="alto_mio_mio[16]_signal" value="tx_clk"/>
<set param="alto_mio_mio[16]_peripheral" value="Enet 0"/>
<set param="alto_mio_mio[16]_signalgroup" value="Enet 0"/>
<set param="alto_preset_mio_16" value="enet0"/>
<set param="alto_enet0_txd[0]_io" value="MIO 17"/>
<set param="alto_mio_mio[17]_signal" value="txd[0]"/>
<set param="alto_mio_mio[17]_peripheral" value="Enet 0"/>
<set param="alto_mio_mio[17]_signalgroup" value="Enet 0"/>
<set param="alto_preset_mio_17" value="enet0"/>
<set param="alto_enet0_txd[1]_io" value="MIO 18"/>
<set param="alto_mio_mio[18]_signal" value="txd[1]"/>
<set param="alto_mio_mio[18]_peripheral" value="Enet 0"/>
<set param="alto_mio_mio[18]_signalgroup" value="Enet 0"/>
<set param="alto_preset_mio_18" value="enet0"/>
<set param="alto_enet0_txd[2]_io" value="MIO 19"/>
<set param="alto_mio_mio[19]_signal" value="txd[2]"/>
<set param="alto_mio_mio[19]_peripheral" value="Enet 0"/>
<set param="alto_mio_mio[19]_signalgroup" value="Enet 0"/>
<set param="alto_preset_mio_19" value="enet0"/>
<set param="alto_enet0_txd[3]_io" value="MIO 20"/>
<set param="alto_mio_mio[20]_signal" value="txd[3]"/>
<set param="alto_mio_mio[20]_peripheral" value="Enet 0"/>
<set param="alto_mio_mio[20]_signalgroup" value="Enet 0"/>
<set param="alto_preset_mio_20" value="enet0"/>
<set param="alto_enet0_tx_ctl_io" value="MIO 21"/>
<set param="alto_mio_mio[21]_signal" value="tx_ctl"/>
<set param="alto_mio_mio[21]_peripheral" value="Enet 0"/>
<set param="alto_mio_mio[21]_signalgroup" value="Enet 0"/>
<set param="alto_preset_mio_21" value="enet0"/>
<set param="alto_enet0_rx_clk_io" value="MIO 22"/>
<set param="alto_mio_mio[22]_signal" value="rx_clk"/>
<set param="alto_mio_mio[22]_peripheral" value="Enet 0"/>
<set param="alto_mio_mio[22]_signalgroup" value="Enet 0"/>
<set param="alto_preset_mio_22" value="enet0"/>
<set param="alto_enet0_rxd[0]_io" value="MIO 23"/>
<set param="alto_mio_mio[23]_signal" value="rxd[0]"/>
<set param="alto_mio_mio[23]_peripheral" value="Enet 0"/>
<set param="alto_mio_mio[23]_signalgroup" value="Enet 0"/>
<set param="alto_preset_mio_23" value="enet0"/>
<set param="alto_enet0_rxd[1]_io" value="MIO 24"/>
<set param="alto_mio_mio[24]_signal" value="rxd[1]"/>
<set param="alto_mio_mio[24]_peripheral" value="Enet 0"/>
<set param="alto_mio_mio[24]_signalgroup" value="Enet 0"/>
<set param="alto_preset_mio_24" value="enet0"/>
<set param="alto_enet0_rxd[2]_io" value="MIO 25"/>
<set param="alto_mio_mio[25]_signal" value="rxd[2]"/>
<set param="alto_mio_mio[25]_peripheral" value="Enet 0"/>
<set param="alto_mio_mio[25]_signalgroup" value="Enet 0"/>
```

```xml
    <set param="alto_preset_mio_25" value="enet0"/>
    <set param="alto_enet0_rxd[3]_io" value="MIO 26"/>
    <set param="alto_mio_mio[26]_signal" value="rxd[3]"/>
    <set param="alto_mio_mio[26]_peripheral" value="Enet 0"/>
    <set param="alto_mio_mio[26]_signalgroup" value="Enet 0"/>
    <set param="alto_preset_mio_26" value="enet0"/>
    <set param="alto_enet0_rx_ctl_io" value="MIO 27"/>
    <set param="alto_mio_mio[27]_signal" value="rx_ctl"/>
    <set param="alto_mio_mio[27]_peripheral" value="Enet 0"/>
    <set param="alto_mio_mio[27]_signalgroup" value="Enet 0"/>
    <set param="alto_preset_mio_27" value="enet0"/>
    <set param="alto_enet0_internal_eth_mode" value="1"/>
</preset>
<preset strength="5" name="EMIO" param="alto_enet0_grp_MDIO_io">
    <set param="alto_enet0_mdc_io" value="EMIO"/>
    <set param="alto_enet0_mdio_io" value="EMIO"/>
</preset>
<preset strength="5" name="MIO 52 .. 53" param="alto_enet0_grp_MDIO_io">
    <set param="alto_enet0_mdc_io" value="MIO 52"/>
    <set param="alto_mio_mio[52]_signal" value="mdc"/>
    <set param="alto_mio_mio[52]_peripheral" value="Enet 0"/>
    <set param="alto_mio_mio[52]_signalgroup" value="MDIO"/>
    <set param="alto_preset_mio_52" value="mdio0"/>
    <set param="alto_enet0_mdio_io" value="MIO 53"/>
    <set param="alto_mio_mio[53]_signal" value="mdio"/>
    <set param="alto_mio_mio[53]_peripheral" value="Enet 0"/>
    <set param="alto_mio_mio[53]_signalgroup" value="MDIO"/>
    <set param="alto_preset_mio_53" value="mdio0"/>
</preset>
<preset name="1000 Mbps" param="alto_enet0_peripheral_freqmhz">
    <set param="alto_enet0_internal_freqmhz" value="125"/>
    <set param="alto_enet0_internal_divisor" value="1"/>
</preset>
<preset name="100 Mbps" param="alto_enet0_peripheral_freqmhz">
    <set param="alto_enet0_internal_freqmhz" value="25"/>
    <set param="alto_enet0_internal_divisor" value="5"/>
</preset>
<preset name="10 Mbps" param="alto_enet0_peripheral_freqmhz">
    <set param="alto_enet0_internal_freqmhz" value="2.5"/>
    <set param="alto_enet0_internal_divisor" value="50"/>
</preset>
    <preset name="1000 Mbps" param="alto_act_enet0_peripheral_freqmhz"> </preset>
    <preset name="100 Mbps" param="alto_act_enet0_peripheral_freqmhz"> </preset>
    <preset name="10 Mbps" param="alto_act_enet0_peripheral_freqmhz"> </preset>
    <preset strength="6" name="enet0" param="alto_preset_mio_16">
      <set param="alto_slcr_MIO_PIN_16_L0_SEL" value="1"/>
      <set param="alto_slcr_MIO_PIN_16_L1_SEL" value="0"/>
      <set param="alto_slcr_MIO_PIN_16_L2_SEL" value="0"/>
```

```
        <set param="alto_slcr_MIO_PIN_16_L3_SEL" value="0"/>
        <set param="alto_mio_16_direction" value="out"/>
        <disable param="alto_mio_16_direction"/>
    </preset>
    <preset strength="6" name="enet0" param="alto_preset_mio_17">
        <set param="alto_slcr_MIO_PIN_17_L0_SEL" value="1"/>
        <set param="alto_slcr_MIO_PIN_17_L1_SEL" value="0"/>
        <set param="alto_slcr_MIO_PIN_17_L2_SEL" value="0"/>
        <set param="alto_slcr_MIO_PIN_17_L3_SEL" value="0"/>
        <set param="alto_mio_17_direction" value="out"/>
        <disable param="alto_mio_17_direction"/>
    </preset>
    <preset strength="6" name="enet0" param="alto_preset_mio_18">
        <set param="alto_slcr_MIO_PIN_18_L0_SEL" value="1"/>
        <set param="alto_slcr_MIO_PIN_18_L1_SEL" value="0"/>
        <set param="alto_slcr_MIO_PIN_18_L2_SEL" value="0"/>
        <set param="alto_slcr_MIO_PIN_18_L3_SEL" value="0"/>
        <set param="alto_mio_18_direction" value="out"/>
        <disable param="alto_mio_18_direction"/>
    </preset>
    <preset strength="6" name="enet0" param="alto_preset_mio_19">
        <set param="alto_slcr_MIO_PIN_19_L0_SEL" value="1"/>
        <set param="alto_slcr_MIO_PIN_19_L1_SEL" value="0"/>
        <set param="alto_slcr_MIO_PIN_19_L2_SEL" value="0"/>
        <set param="alto_slcr_MIO_PIN_19_L3_SEL" value="0"/>
        <set param="alto_mio_19_direction" value="out"/>
        <disable param="alto_mio_19_direction"/>
    </preset>
    <preset strength="6" name="enet0" param="alto_preset_mio_20">
        <set param="alto_slcr_MIO_PIN_20_L0_SEL" value="1"/>
        <set param="alto_slcr_MIO_PIN_20_L1_SEL" value="0"/>
        <set param="alto_slcr_MIO_PIN_20_L2_SEL" value="0"/>
        <set param="alto_slcr_MIO_PIN_20_L3_SEL" value="0"/>
        <set param="alto_mio_20_direction" value="out"/>
        <disable param="alto_mio_20_direction"/>
    </preset>
    <preset strength="6" name="enet0" param="alto_preset_mio_21">
        <set param="alto_slcr_MIO_PIN_21_L0_SEL" value="1"/>
        <set param="alto_slcr_MIO_PIN_21_L1_SEL" value="0"/>
        <set param="alto_slcr_MIO_PIN_21_L2_SEL" value="0"/>
        <set param="alto_slcr_MIO_PIN_21_L3_SEL" value="0"/>
        <set param="alto_mio_21_direction" value="out"/>
        <disable param="alto_mio_21_direction"/>
    </preset>
    <preset strength="6" name="enet0" param="alto_preset_mio_22">
        <set param="alto_slcr_MIO_PIN_22_L0_SEL" value="1"/>
        <set param="alto_slcr_MIO_PIN_22_L1_SEL" value="0"/>
        <set param="alto_slcr_MIO_PIN_22_L2_SEL" value="0"/>
```

```xml
            <set param="alto_slcr_MIO_PIN_22_L3_SEL" value="0"/>
            <set param="alto_mio_22_direction" value="in"/>
            <disable param="alto_mio_22_direction"/>
        </preset>
        <preset strength="6" name="enet0" param="alto_preset_mio_23">
            <set param="alto_slcr_MIO_PIN_23_L0_SEL" value="1"/>
            <set param="alto_slcr_MIO_PIN_23_L1_SEL" value="0"/>
            <set param="alto_slcr_MIO_PIN_23_L2_SEL" value="0"/>
            <set param="alto_slcr_MIO_PIN_23_L3_SEL" value="0"/>
            <set param="alto_mio_23_direction" value="in"/>
            <disable param="alto_mio_23_direction"/>
        </preset>
        <preset strength="6" name="enet0" param="alto_preset_mio_24">
            <set param="alto_slcr_MIO_PIN_24_L0_SEL" value="1"/>
            <set param="alto_slcr_MIO_PIN_24_L1_SEL" value="0"/>
            <set param="alto_slcr_MIO_PIN_24_L2_SEL" value="0"/>
            <set param="alto_slcr_MIO_PIN_24_L3_SEL" value="0"/>
            <set param="alto_mio_24_direction" value="in"/>
            <disable param="alto_mio_24_direction"/>
        </preset>
        <preset strength="6" name="enet0" param="alto_preset_mio_25">
            <set param="alto_slcr_MIO_PIN_25_L0_SEL" value="1"/>
            <set param="alto_slcr_MIO_PIN_25_L1_SEL" value="0"/>
            <set param="alto_slcr_MIO_PIN_25_L2_SEL" value="0"/>
            <set param="alto_slcr_MIO_PIN_25_L3_SEL" value="0"/>
            <set param="alto_mio_25_direction" value="in"/>
            <disable param="alto_mio_25_direction"/>
        </preset>
        <preset strength="6" name="enet0" param="alto_preset_mio_26">
            <set param="alto_slcr_MIO_PIN_26_L0_SEL" value="1"/>
            <set param="alto_slcr_MIO_PIN_26_L1_SEL" value="0"/>
            <set param="alto_slcr_MIO_PIN_26_L2_SEL" value="0"/>
            <set param="alto_slcr_MIO_PIN_26_L3_SEL" value="0"/>
            <set param="alto_mio_26_direction" value="in"/>
            <disable param="alto_mio_26_direction"/>
        </preset>
        <preset strength="6" name="enet0" param="alto_preset_mio_27">
            <set param="alto_slcr_MIO_PIN_27_L0_SEL" value="1"/>
            <set param="alto_slcr_MIO_PIN_27_L1_SEL" value="0"/>
            <set param="alto_slcr_MIO_PIN_27_L2_SEL" value="0"/>
            <set param="alto_slcr_MIO_PIN_27_L3_SEL" value="0"/>
            <set param="alto_mio_27_direction" value="in"/>
            <disable param="alto_mio_27_direction"/>
        </preset>
    </presets>
```

FIG. 8-5

HIERARCHICAL PRESET AND RULE BASED CONFIGURATION OF A SYSTEM-ON-CHIP

TECHNICAL FIELD

This disclosure relates to integrated circuits (ICs) and, more particularly, to configuring a system-on-chip type of IC for operation using hierarchical presets and rules.

BACKGROUND

A system-on-chip (SOC) is an integrated circuit (IC) that includes a plurality of different subsystems. The subsystems are included within a single chip substrate. The subsystems of the SOC are integrated to work cooperatively with one another. One example of an SOC is a chip level implementation of a computer or other data processing system. For example, the SOC may include a processor that executes program code such as an operating system and/or one or more applications. The processor operates cooperatively with one or more of the other on-chip subsystems. The other subsystems may be digital circuits, analog circuits, mixed-signal circuits, or the like. Exemplary subsystems that may be included within an SOC and operate cooperatively with a processor may include, but are not limited to, wireless transceivers, signal processors, CODECs, memory, memory controllers, I/O peripherals, and the like.

The subsystems of the SOC are often varied and specialized. Each subsystem typically has a plurality of control registers that control the functionality and/or behavior of that subsystem. In the usual case, a subsystem has hundreds or thousands of different control registers. Taking a system-wide view, the number of control registers of an SOC may be overwhelming to a user attempting to implement a circuit design therein.

SUMMARY

A method includes receiving a user input selecting a first circuit block of a system-on-chip (SOC) for enablement, determining, using a processor, a first top level preset according to the user input for the first circuit block, determining selected intermediate presets from a plurality of hierarchically ordered presets for the first circuit block, and automatically determining low level presets for the first circuit block according to the selected intermediate presets for the first circuit block. The low level presets are output, e.g., by loading them into the SOC.

A system includes a processor programmed to initiate executable operations. The executable operations include receiving a user input selecting a first circuit block of an SOC for enablement, determining a first top level preset according to the user input for the first circuit block, determining selected intermediate presets from a plurality of hierarchically ordered presets for the first circuit block, and automatically determining low level presets for the first circuit block according to the selected intermediate presets for the first circuit block. The low level presets are output, e.g., by loading them into the SOC.

A non-transitory computer-readable storage medium has instructions stored thereon which, when executed by a processor, perform a method. The method includes receiving a user input selecting a first circuit block of an SOC for enablement, determining, using a processor, a first top level preset according to the user input for the first circuit block, determining selected intermediate presets from a plurality of hierarchically ordered presets for the first circuit block, automatically determining low level presets for the first circuit block according to the selected intermediate presets for the first circuit block, and outputting the low level presets, e.g., by loading them into the SOC.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description with reference to the drawings.

FIGS. 8-1 through 8-5, taken together, illustrate an example of a preset hierarchy specified in eXtensible Markup Language (XML) format.

DETAILED DESCRIPTION

Figure 1:
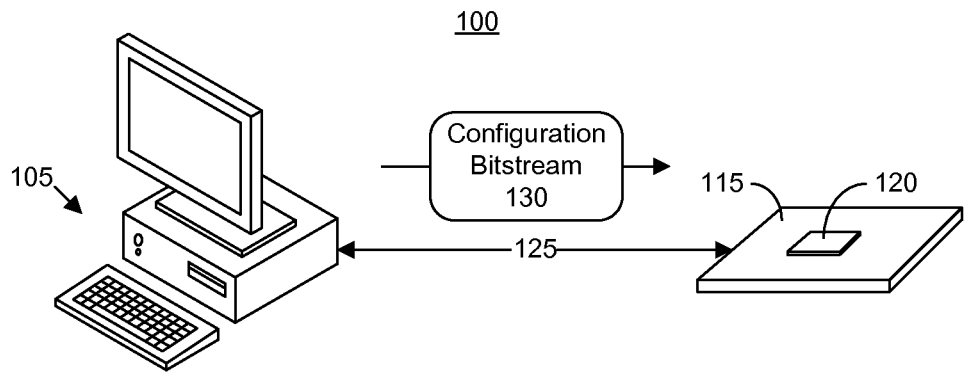
FIG. 1 is a block diagram illustrating an exemplary development environment.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to configuring a system-on-chip (SOC) type of IC for operation using hierarchical presets and rules. SOC type ICs typically undergo an initialization process during startup or boot that requires configuration of various circuit blocks. These circuit blocks are located within a processor system of the SOC. As an example, the processor system may include thousands of control registers used to store values of configuration parameters for the circuit blocks included therein.

As part of the circuit design process, a user must determine the correct values to be loaded into the control registers during initialization of the SOC. Typically users maintain many large configuration files, where each configuration file stores values for the registers of the processor system needed to implement a particular processor system configuration or particular application. The user may select a configuration file considered related to the desired processor system configuration and manually adapt that processor system configuration to one that is desired. This process is often tedious and error prone.

In accordance with the inventive arrangements described herein, a user is guided through configuration of circuit blocks of the processor system of the SOC using one or more sets of hierarchically ordered presets. One or more rules are associated with the presets. When applied, the rules identify further presets at deeper levels of the hierarchy and, as such, are used to navigate the hierarchy. The hierarchy is traversed until low level presets are reached. Low level presets are end points, or leaf nodes, of the hierarchy. Low level presets specify the actual values, or configuration bits, that are to be written to the appropriate control registers of processor system circuit blocks to achieve the desired SOC configuration. In traversing the hierarchy, conflicting circuit block configurations also may be detected.

The inventive arrangements described herein may be implemented as a method or process performed by a data processing system for determining a processor system configuration. In another aspect, the inventive arrangements may be implemented as a data processing system having a processor. The processor, upon executing program code, generates a processor system configuration. In still another aspect, the inventive arrangements may be implemented as a non-transitory computer-readable storage medium storing program code that, when executed, causes a processor and/or a system to perform and/or initiate a method or process of determining a processor system configuration.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary development environment (environment) 100. As pictured, environment 100 includes a data processing system 105. Data processing system 105, for example, may be implemented as a computer system or the like. Data processing system 105 is coupled to a target platform 115 through a communication link 125.

Target platform 115 may be implemented as a circuit board such as a printed circuit board having circuitry implemented thereon. Target platform 115 further may be included within a larger system. Target platform 115 may include a connector that couples to communication link 125. The connector may be coupled, using circuitry of target platform 115, to an IC 120. IC 120 is coupled to target platform 115 using a socket, a receptacle, another mounting technique such as soldering IC 120 directly to target platform 115, or the like. In any case, IC 120 couples to communication link 125 through target platform 115. In one aspect, IC 120 is a programmable IC. In another aspect, IC 120 is a system-on-chip (SOC).

As noted, data processing system 105 is coupled to target platform 115 through communication link 125. Communication link 125 may be implemented as any of a variety of different wired and/or wireless connections. Exemplary wired implementations of communication link 125 include, but are not limited to, point-to-point Ethernet, Universal Serial Interconnect (USB), FireWire (IEEE 1394 interface), or the like. Exemplary wireless implementations of communication link 125 include, but are not limited to, Bluetooth®, Wi-Fi®, or the like. In the case of a wireless implementation of communication link 125, the connector of target platform 115 may be implemented as a wireless transceiver. The exemplary communication links noted within this disclosure are provided for purposes of illustration only and not intended as limitations.

In operation, a user works through data processing system 105 and communicates with IC 120. Data processing system 105, for example, under the control of a user may generate a processor system configuration. In one aspect, the processor system configuration may be included in a configuration bitstream 130 also generated by system 105. System 105 sends configuration bitstream 130 to IC 120. Responsive to loading configuration bitstream 130, IC 120 loads the processor system configuration into control registers of the processor system and implements a user-specified circuit design. The processor system configuration specifies various operational parameters determined by data processing system 105 that are necessary for IC 120 to function properly. In another aspect, system 105 may send only the processor system configuration to IC 120, which may then be loaded into the control registers of the processor system of IC 120.

Figure 2:
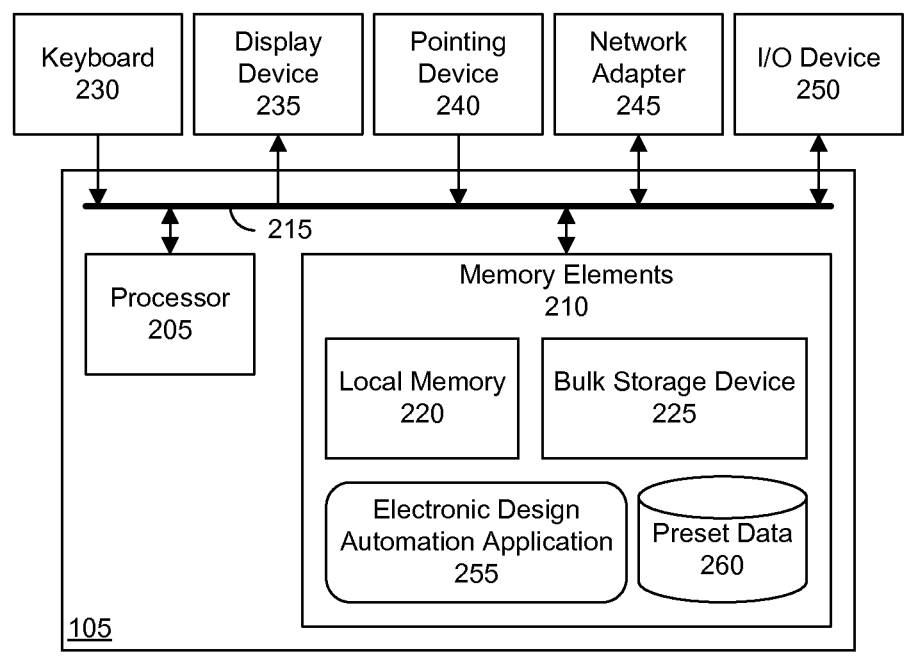
FIG. 2 is a block diagram illustrating an exemplary data processing system.

FIG. 2 is a block diagram illustrating an exemplary implementation of data processing system (system) 105 of FIG. 1. System 105 includes at least one processor, e.g., a central processing unit (CPU), 205 coupled to memory elements 210 through a system bus 215 or other suitable circuitry. System 105 stores program code within memory elements 210. Processor 205 executes the program code accessed from memory elements 210 via system bus 215. In one aspect, system 105 is implemented as a computer or other data processing system that is suitable for storing and/or executing program code. It should be appreciated, however, that system 105 can be implemented in the form of any system including a processor and memory that is capable of performing the functions described within this disclosure.

Memory elements 210 include one or more physical memory devices such as, for example, a local memory 220 and one or more bulk storage devices 225. Local memory 220 refers to random access memory (RAM) or other non-persistent memory device(s) generally used during actual execution of the program code. Bulk storage device 225 may be implemented as a hard disk drive (HDD), solid state drive (SSD), or other persistent data storage device. System 105 may also include one or more cache memories (not shown) that provide temporary storage of at least some program code in order to reduce the number of times program code must be retrieved from bulk storage device 225 during execution.

Input/output (I/O) devices such as a keyboard 230, a display device 235, and a pointing device 240 may optionally be coupled to system 105. The I/O devices may be coupled to system 105 either directly or through intervening I/O controllers. A network adapter 245 may also be coupled to system 105 to enable system 105 to become coupled to other systems, computer systems, remote printers, and/or remote storage devices through intervening private or public networks. Modems, cable modems, Ethernet cards, and wireless transceivers are examples of different types of network adapter 245 that may be used with system 105.

System 105 further may be coupled to an I/O device 250, through which system 105 may communicate with target platform 115 and/or IC 120.

As pictured in FIG. 2, memory elements 210 store an electronic design automation (EDA) application 255. EDA application 255, being implemented in the form of executable program code, is executed by system 105. As such, EDA application 255 is considered an integrated part of system 105.

EDA application 255 utilizes preset data 260 to determine values for control registers within a processor system of an SOC. Preset data 260 includes one or more hierarchies of presets, wherein each hierarchy corresponds to a particular processor system feature and/or processor system circuit block. Preset data 260 further includes one or more rules that may be associated with various ones of the presets in the hierarchies included therein. EDA application 255, preset data 260, and any data items used, generated, and/or operated upon by system 105 are functional data structures that impart functionality when employed as part of system 105 or when such elements, including derivations thereof, are loaded into an IC such as a programmable IC.

Figure 3:
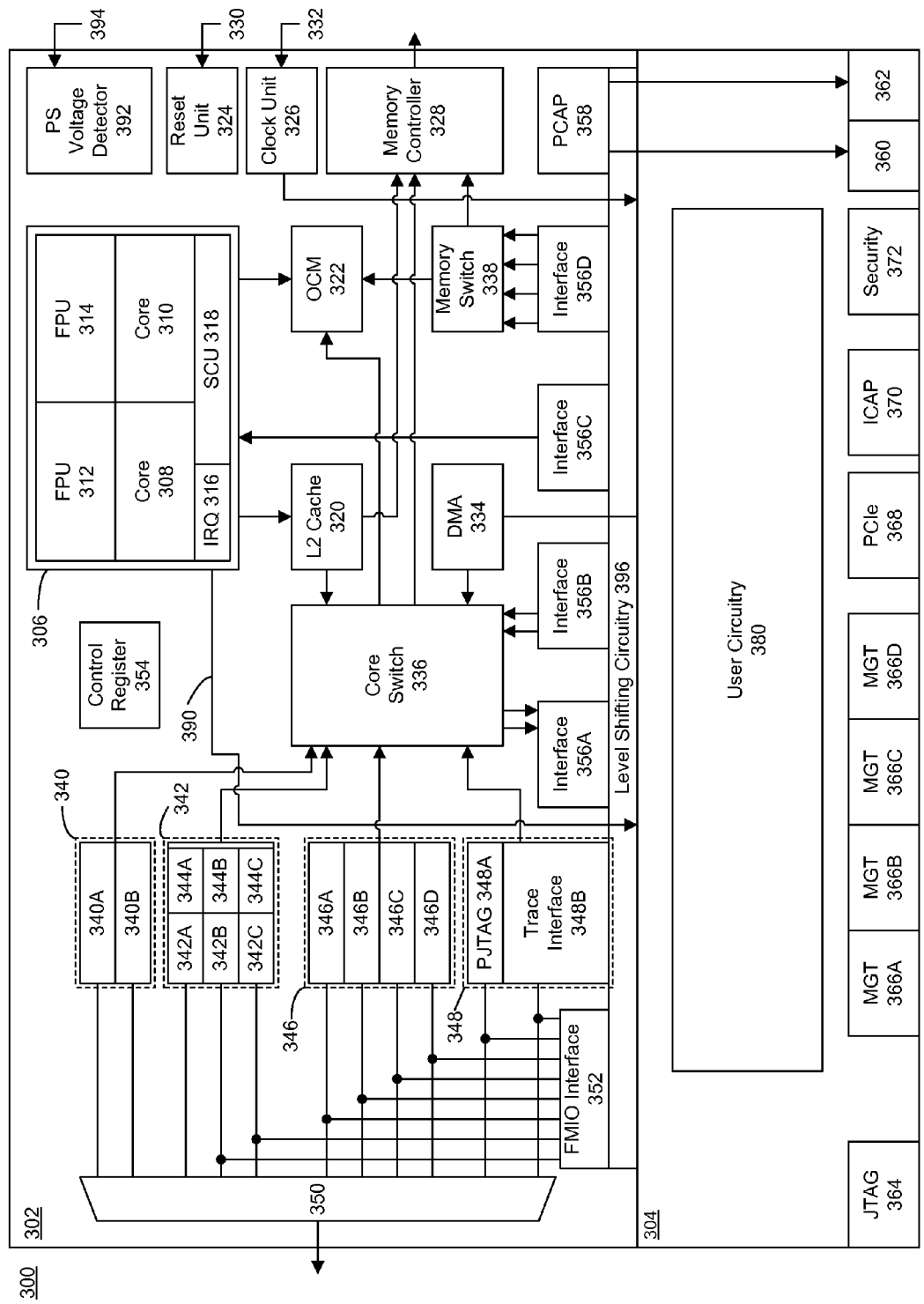
FIG. 3 is a block diagram illustrating an exemplary integrated circuit (IC).

FIG. 3 is a block diagram illustrating an exemplary IC 300. IC 300 may be implemented using any of a variety of different architectures that include a processor system and programmable circuitry. As illustrated, IC 300 includes a processor system 302 coupled to a programmable circuitry 304. FIG. 3 is illustrates one example of an SOC type of IC for which system 105 may determine processor system configurations.

In the example shown in FIG. 3, processor system 302 is illustrated as occupying approximately two-thirds of the die of IC 300, while programmable circuitry 304 is shown as occupying approximately one-third of the same die. FIG. 3 is not, however, intended to be a scale representation of IC 300. Rather, FIG. 3 is provided for purposes of illustration and is not intended as a limitation of the inventive arrangements described within this disclosure.

In general, processor system 302 is implemented as a hard-wired system within IC 300. To the extent that various components or modules within processor system 302 are coupled by lines, e.g., signal or communication links, that have arrows, such arrows are intended to illustrate the direction or flow of control. In this regard, a signal illustrated as a line with a directional arrow generally indicates that control over the signal is exerted by the source component from which the arrow emanates rather than the target component to which the arrow points. The arrows, in general, are not intended to indicate one-way flow of data or directionality of the signal. Signals may be implemented as bi-directional signals or communication links despite the presence of the directional arrow.

Within this specification, the same reference characters are used to refer to terminals, signal lines, wires, and their corresponding signals. In this regard, the terms "signal," "wire," "connection," "terminal," and "pin" may be used interchangeably from time-to-time within the this specification. It also should be appreciated that the terms "signal," "wire," or the like may represent one or more signals, e.g., the conveyance of a single bit through a single wire or the conveyance of multiple parallel bits through multiple parallel wires. Further, each wire or signal, as noted, may represent bi-directional communication between two, or more, components connected by that signal or wire as the case may be.

As shown, processor system 302 may include a core complex 306. Core complex 306 may include cores 308 and 310, floating point units (FPUs) 312 and 314, an interrupt request unit (IRQ) 316, and a snoop control unit (SCU) 318. Each of cores 308 and 310 may include a level 1 (L1) cache (not shown) embedded therein. While any of a variety of different types of processor cores capable of executing program code and/or FPUs, e.g., math co-processors or DSP units, may be used, in one example, cores 308 and 310 each may be implemented as an ARM Cortex™-A9 type of processor core with each core having a 32 KB instruction cache and a 32 KB data cache. FPUs 312 and 314 may be implemented in the form of NEON™ media and/or floating point processing engines capable of providing 128-bit vector-based DSP functions. The ARM Cortex™-A9 processor cores and the NEON™ media and/or floating point processing engines are available from ARM Ltd of Cambridge, UK (ARM).

While illustrated as a dual core or a multi-core system, in another example, core complex 306 may include a single core that can execute program code. In that case, core complex 306 may include the single core or processor coupled to IRQ 316 and SCU 318. Further, FPUs 312 and 314 need not be included, though a single FPU unit may be included and coupled to the single core if desired.

Referring again to FIG. 3, core complex 306 is coupled to various processor hardware resources such as a level 2 (L2) cache 320 and an on-chip memory (OCM) 322. L2 cache 320 may be implemented as a 256 KB memory. OCM 322 may also be implemented as a 256 KB memory. Cores 308 and 310 and FPUs 312 and 314 may directly access L2 cache 320 and OCM 322. In general, OCM 322 provides local memory that is available to processor system 302 and/or to programmable circuitry 304, e.g., circuits implemented within programmable circuitry 304. By comparison, L2 cache 320, which is also a memory, functions as a cache for processor system 302. Accordingly, L2 cache 320 may store small blocks or portions of data, e.g., 256 bits, which are effectively copies of data bits stored in RAM, e.g., execution memory off-chip. If, for example, a read request is issued for data stored in L2 cache 320, the data can be read from L2 cache 320 as opposed to being retrieved from the RAM.

Processor system 302 may include further hardware processor resources such as a reset unit 324, a clock unit 326, and a memory controller 328. Reset unit 324 may receive one or more signals originating from a source external to IC 300, e.g., signal 330. Signal 330 may instruct reset unit 324 to reset processor system 302 and/or one or more or all of the components within processor system 302. Reset unit 324 further can receive signals requesting powering on or off of programmable circuitry 304.

Clock unit 326 can receive one or more reference signals, e.g., signal 332, from a source external to IC 300. Clock unit 326, for example, may be implemented as, or include, phase-lock loop circuitry capable of synchronizing to received signal 332. Clock unit 326 may generate one or more clock signals of one or more different frequencies that may be distributed throughout processor system 302 (not shown). Further, clock unit 326 may generate one or more clock signals of one or more different frequencies that can be distributed to programmable circuitry 304 for use by circuits implemented therein.

Memory controller 328 may be implemented to communicate with one or more different types of RAMs located external to IC 300, e.g., "off-chip." For example, memory controller 328 may be implemented to access, e.g., read and/or write, various types of memory including, but not limited to, Dual Data Rate (DDR) 2, DDR3, Low Power (LP) DDR2 types of memory, whether 16-bit, 32-bit, 16-bit with ECC, etc. The list of different memory types with which memory controller 328 is able to communicate is provided for purposes of illustration only and is not intended as a limitation or to be exhaustive.

Processor system 302 may also include hardware processor resources such a direct memory access (DMA) interface 334 that is coupled to a core switch 336 and to programmable circuitry 304. Processor system 302 further includes a memory switch 338 type of hardware processor resource that couples to one of interfaces 356, i.e., interface 356D, to be described within this specification in greater detail, OCM 322, and memory controller 328.

Core switch 336 routes signals among various components of processor system 302 as shown. In one aspect, core switch 336 may be coupled directly to an internal bus of processor system 302 (not shown). In such an embodiment, each other component within processor system 302 that connects with core switch 336 may be coupled to core switch 336 through the internal bus. For example, other processor hardware resources such as I/O devices (e.g., interfaces) 340, 342, 346, and 348 each may couple to core switch 336 via the internal bus. The internal bus can be implemented as any of a variety of different buses such as, for example, an Advanced Peripheral Bus (APB), or the like.

As noted, processor system 302 may include hardware processor resources such as one or more different types of I/O devices or interfaces. Processor system 302 may provide flash memory type I/O devices, higher performance I/O devices, lower performance interfaces, debugging I/O devices, and/or RAM I/O devices. The RAM I/O devices, i.e., memory controller 328, have been described within this specification.

Regarding additional types of I/O devices, processor system 302 may include one or more flash memory interfaces 340 illustrated as 340A and 340B. For example, one or more of flash memory interfaces 340 can be implemented as a Quad-Serial Peripheral Interface (QSPI) configured for 4-bit communication. One or more of flash memory interfaces 340 may be implemented as a parallel 8-bit NOR/SRAM type of interface. One or more of flash memory interfaces 340 may be implemented as a NAND interface configured for 8-bit and/or or 16-bit communication. It should be appreciated that the particular interfaces described are provided for purposes of illustration and not limitation. Other interfaces having different bit widths can be used.

Processor system 302 can include one or more of I/O devices 342 providing a higher level of performance than I/O devices 340. Each of I/O devices 342A-342C may be coupled to a DMA controller 344A-344C respectively. For example, one or more of I/O devices 342 may be implemented as a Universal Serial Bus (USB) type of interface. One or more of I/O devices 342 may be implemented as a gigabit Ethernet type of interface. One or more of I/O devices 342 may be implemented as a Secure Digital (SD) type of interface.

Processor system 302 can include one or more I/O devices 346 such as I/O devices 346A-346D that provide a lower level of performance than I/O devices 342. For example, one or more of I/O devices 346 may be implemented as a General Purpose I/O (GPIO) type of interface. One or more of I/O devices 346 may be implemented as a Universal Asynchronous Receiver/Transmitter (UART) type of interface. One or more of I/O devices 346 may be implemented in the form of a Serial Peripheral Interface (SPI) bus type of interface. One or more of I/O devices 346 may be implemented in the form of a Controller-Area-Network (CAN) type of interface and/or an I²C type of interface. One or more of I/O devices 346 may also be implemented in the form of a Triple Timer Counter (TTC) and/or a Watchdog Timer (WDT) type of interface.

Processor system 302 may include one or more debug I/O devices 348 such as processor JTAG (PJTAG) port or interface 348A and a trace interface 348B. PJTAG port 348A may provide an external debug interface for processor system 302. Trace interface 348B may provide a port to receive debug, e.g., trace, information from programmable circuitry 304, a port to send debugging data of processor system 302 out to programmable circuitry 304, and a cross trigger port. The cross trigger port allows circuitry within programmable circuitry 304 to trigger debug functions such as trace within processor system 302. Similarly, processor system 302 can initiate debug functions within circuits implemented within programmable circuitry 304.

As shown, each of I/O devices 340, 342, 346, and 348 may be coupled to a multiplexer 350. Multiplexer 350 provides a plurality of outputs that may be directly routed or coupled to external pins of IC 300, e.g., balls of the package within which IC 300 is disposed. For example, a plurality of I/O pins of IC 300, e.g., 53 pins, may be shared among interfaces 340, 342, 346, and 348. A user may configure multiplexer 350, as part of processor system 302, to select which of interfaces 340-348 are to be used and, therefore, coupled to I/O pins of IC 300 via multiplexer 350.

As shown, signals that couple I/O devices 342-348 to multiplexer 350 may also be coupled to a fabric multiplexer input/output (FMIO) interface 352. Accordingly, based upon user configuration of IC 300 and, more particularly, processor system 302, any one of I/O devices 342, 346, and/or 348 may be coupled to programmable circuitry 304 of IC 300 via FMIO interface 352. FMIO interface 352, for example, may include a configurable switch for each signal line coupled thereto allowing the signal line to be selectively coupled to programmable circuitry 304 depending upon the state of that switch. FMIO interface 352, and the switches included therein, can be configured as part of processor system 302, e.g., via control registers 354, to determine which signals pass from I/O devices 342-348 to programmable circuitry 304. This allows data communicated from any one of interfaces 342-348 to be routed to circuitry within programmable circuitry 304 for further processing and/or monitoring. Data received via one or more of the I/O pins coupled to I/O devices 342, 346, and 348 may be routed to programmable circuitry 304 for further processing through one or more of interfaces 356.

FMIO interface 352 allows data that is output from I/O devices 342, 346, and 348 to be provided to one or more of the I/O pins, to selected circuits implemented within programmable circuitry 304, e.g., user circuitry 380, or to both one or more I/O pins concurrently with selected circuits implemented within programmable circuitry 304. It should be appreciated that to couple to FMIO interface 352, circuits implemented within programmable circuitry 304 must be configured to do so through the loading of configuration data to form or implement the physical circuitry.

In an embodiment, each of I/O devices 340, 342, 346, and 348 may be configured to generate an interrupt signal illustrated as signal 390. For example, each of I/O devices 340A-340B, 342A-342C, 346A-346D, and 348A-348B may be configured to generate an interrupt on signal 390. As shown, signal 390 couples to IRQ 316 of core complex 306 and is also coupled directly to programmable circuitry 304. Interrupt signal 390, being located within processor system 302, is hard-wired, e.g., fixed wiring. Accordingly, interrupts generated by any of I/O devices 340-348 may be provided to core complex 306 and/or to programmable circuitry 304 thereby facilitating use of I/O devices 340-348 by either programmable circuitry 304 and/or core complex 306. An interrupt from each of I/O devices 340-348, for example, can be provided concurrently to IRQ 316 and to programmable circuitry 304.

Control registers 354 may be configured to control various, if not most, aspects of processor system 302. One or more commands and/or configuration parameters may be written to control registers 354 to control or regulate operation of processor system 302. For example, circuits within programmable circuitry 304 may write to control registers 354 through an interface such as interface 356B, to be described herein in further detail. Control registers 354 control or regulate functions such as enabling particular circuit blocks, controlling intellectual property (IP) enable resets, setting clock frequencies generated by clock unit 326, specifying I/O drive strength, the state of FMIO interface 352 in terms of which signals are routed through to programmable circuitry 304, and other system level functions. Control registers 354 regulate additional functions such as powering down processor system 302, powering down or deactivating particular interfaces of processor system 302 independently, or the like. Control registers 354 may be accessed through a bus such as, for example, an APB (not shown), that couples control registers 354 to core switch 336. Control registers 354 further may be written during loading of a configuration bitstream for IC 300 specifying a circuit design inclusive of the processor system configuration.

Processor system 302 may also include one or more interfaces 356, depicted as interfaces 356A-356D, that couple directly with programmable circuitry 304. In one example, one or more or all of interfaces 356 may be implemented in accordance with the AMBA AXI Protocol Specification (AXI) as published by ARM. For example, each of interfaces 356 may be implemented in conformance with the AMBA AXI Protocol Specification v. 3.0, which is incorporated herein by reference in its entirety. In general, AXI is a high performance, high frequency interface that is suitable for submicron interconnect.

Referring again to FIG. 3, interfaces 356A and 356B, for example, each may be implemented to provide two, 32-bit channels that couple programmable circuitry 304 with core switch 336. Interface 356A may be implemented as a general-purpose master interface. Interface 256A, for example, may be used to perform general purpose transfers of data from processor system 302 and/or a DMA controller therein, to programmable circuitry 304. Interface 356B can be implemented as a general-purpose slave interface. For example, interface 356B can be used to perform general purpose data transfer between processor system 302 and programmable circuitry 304.

Through interfaces 356A-356B and core switch 336, circuits implemented within programmable circuitry 304 may access various ones of I/O devices 340, 342, 346, and 348. Through interfaces 356A and/or 356B, in combination with core switch 336, circuits within programmable circuitry 304 further may access OCM 322 directly and off-chip memory through memory controller 328, etc.

Interface 356C may be implemented as a 64-bit slave interface that couples programmable circuitry 304 directly with core complex 306 and, more particularly, SCU 318. Through interface 356C and SCU 318, circuits implemented within programmable circuitry 304 are provided with direct access to the L1 cache within each of cores 308 and 310, IRQ 316, L2 cache 320, and OCM 322. Accordingly, circuits within programmable circuitry 304 can read and/or write to such memories and detect interrupts generated or asserted within core complex 306. For example, interface 356C may provide coherent access to core complex 306 that is suitable for use by circuits functioning as co-processors. In illustration, a soft processor implemented within programmable circuitry 304 in the form of user circuitry 380 can communicate with processor system 302 via interface 356C.

Programmable circuitry 304 is configurable to directly detect interrupts from I/O devices 340, 342, 346, and 348, or to detect interrupts from IRQ 316. It should be appreciated that IRQ 316 allows programmable circuitry 304 to detect processor-specific or processor-generated interrupts that originate within core complex 306. Signal 390 further may represent one or more interrupts from programmable circuitry 304 that may be provided to IRQ 316 as ports or signals and/or one or more copies of interrupts from processor system 302, and in particular from core complex 306, that may be provided to programmable circuitry 304 as ports or signals.

Interface 356D may be implemented to provide a plurality, e.g., four, 64-bit slave interfaces. Interface 356D may be used to exchange large amounts of data between processor system 302 and circuits implemented within programmable circuitry 304 efficiently. As shown, interface 356D provides circuits implemented within programmable circuitry 304 with access to OCM 322 via memory switch 338 and access to off-chip memory via memory switch 338 and memory controller 328.

In addition, processor system 302 may include a processor system voltage detector 392. Processor system voltage detector 392 monitors incoming voltage sources from a power supply depicted as signal 394. Responsive to determining that the voltage of signal 394 meets a predetermined voltage level, processor system voltage detector 392 enables one or more other components by issuing control signals (not shown). For example, responsive to determining that the voltage of signal 394 is at least a minimum voltage level, processor system voltage detector 392 enables one or more IOBs of IC 300. In another example, responsive to determining that the voltage of signal 394 meets a minimum voltage level, processor system voltage detector 392 can enable one or more level shifters collectively shown as level shifting circuitry 396.

IC 300 may include level shifting circuitry 396 to facilitate transfer of signals between processor system 302 and programmable circuitry 304. Level shifting circuitry 396 helps to electrically isolate processor system 302 from programmable circuitry 304 and is configured to convert signals at a first voltage level to signals at a second voltage level. In some cases, the first and second voltage levels can be different voltage values. For example, in some cases, processor system 302 may operate using a power signal having a different voltage potential than the power signal provided to programmable circuitry 304. In other cases, processor system 302 may receive one or more power signals that have, or are intended to have, a same voltage potential as power signals provided to programmable circuitry 304. The power signals, however, may be independently controlled, resulting in two different power domains despite the similarity or sameness of the voltage potentials of the power signals. The independence of the power signals can cause small variations in the voltage potential of the power signals provided to processor system 302 as compared to the power signals provided to programmable circuitry 304. Level shifting circuitry 396 allows processor system 302 to function as one power domain and programmable circuitry 304 to function as a different and independent power domain, thereby allowing programmable circuitry 304 to be powered on and power off independently of processor system 302, e.g., while processor system 302 remains powered on and operational.

To account for the potential variations in the power signals and also to support the ability to power cycle programmable circuitry 304 independently of processor system 302, signals crossing between processor system 302 and programmable circuitry 304 may be passed through level shifting circuitry 396. Though illustrated as a single block, it should be appreciated that each of the various interfaces described, e.g., FMIO interface 352, trace interface 348B, interfaces 356A-356D, processor configuration access port (PCAP) 358, and any other signals such as clock signals and DMA signals, may include, or pass through, level shifters represented by level shifting circuitry 396. Level shifting circuitry 396 ensures that voltage levels for signals that propagate between processor system 302 and programmable circuitry 304 are matched.

Processor system 302 further includes PCAP 358. As shown, PCAP 358 may be coupled to a configuration controller 360 and a system monitor block 362, both located within programmable circuitry 304. Though not shown, PCAP 358 may be coupled core switch 336 allowing processor system 302 to receive configuration data via any of the I/O devices 340-348 and 328, for use in configuring programmable circuitry 304.

Programmable circuitry 304 may be implemented to include one or more programmable circuit blocks that can be coupled together using programmable interconnect circuitry. The programmable circuit blocks and the programmable interconnect circuitry can be configured to implement one or more different physical circuits, e.g., user circuitry 380, based upon configuration data loaded into IC 300. It should be appreciated that programmable circuitry 304, with the exception of various hard-wired circuits that may be implemented therein, is not operational or functional until configuration data is loaded within configuration memory causing physical circuitry to be implemented within programmable circuitry 304. As noted, the configuration data that is loaded specifies connectivity of user circuitry 380 to one or more signals of FMIO interface 352, interrupts 390, interfaces 356, and the like.

Configuration controller 360 and system monitor block 362 may be implemented in the form of hard-wired circuitry. Configuration controller 360 is responsible for writing configuration data to configuration memory cells thereby physically implementing circuitry specified by the configuration data within programmable circuitry 304. In one aspect, configuration controller 360 may write a processor system configuration to control registers 354. System monitor block 362 performs functions such as analog-to-digital conversion, voltage monitoring, current monitoring, and/or temperature monitoring.

As noted, programmable circuitry 304 may also be configured to implement one or more I/O devices in the form of hard-wired circuits. For example, a JTAG interface 364, one or more MGTs 366A-366D, a Peripheral Component Interconnect Express (PCIe) interface 368, an Internal Configuration Access Port (ICAP) 370, and a security port 372 may be included as hard-wired circuits despite being located within programmable circuitry 304 of IC 300. The various I/O devices within programmable circuitry 304 illustrate exemplary interfaces that may be implemented and are not intended to be restrictive or limiting of the inventive arrangements described within this disclosure.

For example, configuration data may be loaded into IC 300 and received by configuration controller 360. In one aspect, configuration data may be received through processor system 302, which can control the configuration process of IC 300. Configuration controller 360 may load the configuration data received from processor system 302 via PCAP 358 within configuration memory (not shown) of IC 300. Different physical circuits such as user circuitry 380 may be implemented or formed within programmable circuitry 304 as specified by the particular configuration data loaded into the configuration memory of IC 300. It should be appreciated that the loading of configuration data in this manner, due to the use of hard-wired circuitry, requires no initial configuration of programmable circuitry 304. Circuits implemented within programmable circuitry 304, in consequence of loading configuration data, though physical circuits, typically are referred to as "soft" in that the circuitry is formed within programmable circuitry 304 rather than being hard-wired or otherwise fixed within IC 300, which is to be distinguished from processor system 302.

In one aspect, programmable circuitry 304 is implemented as a field programmable gate array (FPGA) or a portion thereof. An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

As noted, FIG. 3 is illustrative of an SOC type of IC. In order to operate correctly and as intended for a given circuit design, the numerous circuit blocks within processor system 302 must be configured. As apparent from the complexity of processor system 302, each circuit block has numerous configuration parameters set through control registers 354, which must store the correct values for configuration parameters for each of the various circuit blocks described to function properly.

Figure 4:
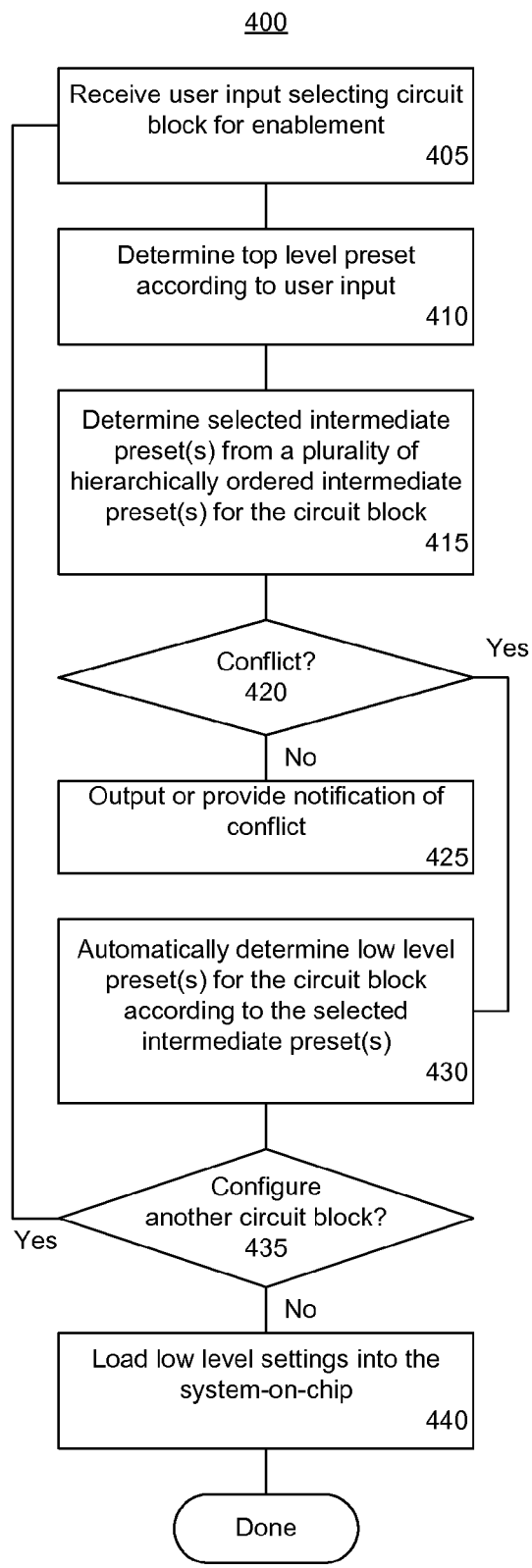
FIG. 4 is a flow chart illustrating an exemplary method of determining a processor system configuration for a system-on-chip type of IC.

FIG. 4 is a flow chart illustrating an exemplary method 400 of determining a processor system configuration for an SOC. Method 400 may be implemented by a data processing system such as system 105 described herein executing EDA application 255. The system, in implementing method 400, determines a configuration for the processor system of an SOC. The processor system configuration specifies values that are written, or stored, within various control registers of the processor system. The values, once written into the control registers, define the behavior of particular circuit blocks implemented within the processor system of the SOC.

Method 400 may begin in block 405 where the system receives a user input. The user input may specify a particular circuit block of the processor system of an SOC for enablement. For example, the user input may specify that the memory controller is to be enabled, that a USB I/O device is to be enabled, or the like. In another example, the user input may specify a high level feature desired for the circuit design such as the use of DDR memory, or the like.

In block 410, the system determines a top level preset according to the received user input. For example, responsive to determining that the user input specifies enablement of the memory controller, the system determines a top level preset for the memory controller. In another example, responsive to determining that the user input specifies enablement of a USB I/O device, the system determines a top level preset for the USB I/O device.

In one aspect, the top level preset is a root node of a set of hierarchically ordered presets for the selected circuit block. Each top level preset represents a feature of the SOC, e.g., a circuit block, requested by the user. Beneath the top level preset, the hierarchy is formed of a plurality of intermediate presets. The system traverses the hierarchy of presets from the top level preset and ultimately converges to the low level presets of the hierarchy, which specify values for specific control registers of the circuit block(s) requested by the user. The system automatically determines the necessary values for the control registers of the circuit block(s) based upon the user requested feature(s). By converging to the values in the hierarchy, the user may provide far fewer inputs to the system than would otherwise be required.

It should be appreciated that a given hierarchy for one circuit block may include intermediate presets and values for control registers of circuit blocks other than the particular circuit block requested by the user in block 405. For example, a hierarchy for a particular I/O device may require values for writing to the control registers of the clock unit 320. Similarly, the I/O device may require values for writing to the control registers of the multiplexer 350. The intermediate presets in a given path from the top level preset to the low level presets are compatible with one another to implement an overall implementation for the circuit block.

In block 415, the system determines selected intermediate preset(s) from the plurality of hierarchically ordered presets for the circuit block. The system determines the intermediate presets by applying one or more rules to the received user inputs. In one aspect, each preset, whether a top level preset or an intermediate preset, within the hierarchy may be associated with one or more rules. The system applies the rules to the received user input to determine a path through the hierarchy of presets.

In one aspect, the rules attached to intermediate presets specify any associated values and/or calculations for determining further presets and/or parameters of the circuit block. The rules, for example, may define the limitations of the circuit block in terms of what is allowed and what is not allowed for the processor configuration. The rules further may define contingencies such as if the user desires option "X," then option "Y" must also be selected. Upon evaluation of the calculations specified by the rules and determining an output, one or more next intermediate preset(s) may be selected or chosen.

In some cases, presets may be directly associated with one or more other presets at a next level of the hierarchy without having to execute a rule. For example, a top level preset may be associated with one or more fixed intermediate level presets that are located in the hierarchy without execution of a rule to select among one of a plurality of potentially alternate paths through the hierarchy.

In block 420, the system determines whether a conflict has occurred. A conflict occurs when the system selects an intermediate preset of the hierarchy that is already utilized by another, different circuit block configuration. For example, consider the case in which the user selected circuit block is an I/O device. The I/O device requires access to particular I/O pins from multiplexer 350 that are already utilized by another circuit block. In that case, the system determines that the needed I/O pins are already used to support a different circuit block and are unavailable for the selected I/O device. The system is unable to traverse the hierarchy any further to reach the leaf node(s) since the needed intermediate preset, i.e., the intermediate preset for using particular I/O pins from multiplexer 350, is unavailable and in use for another circuit block.

If the system detects a conflict, method 400 continues to block 425. In block 425, the system outputs a notification of the conflict. If the system does not detect a conflict, method 400 proceeds to block 430.

In block 430, the system automatically determines low level presets for the circuit block according to the selected intermediate presets of the hierarchy of presets. The rules are applied, or direct parent-child relationships among presets are evaluated, by the system to determine next intermediate presets until each path being taken through the hierarchy leads to one or more low level presets specifying control register values.

In block 435, the system determines whether the user wishes to configure another circuit block. If so, method 400 loops back to block 405 to continue processing. If not, method 400 proceeds to block 440. In block 440, the system optionally loads the low level presets into the SOC, thereby configuring the user specified circuit blocks for operation. In one aspect, the system may load the low level presets within the SOC independently of a circuit design. For example, the system may load the circuit design, or the portion of the circuit design not including the already loaded low level presets, subsequent to loading the low level presets.

It should be appreciated, however, that block 440 represents one of a plurality of different techniques for outputting low level presets. Another example of outputting the low level presets may include the system including the low level presets within a user-defined circuit design. The circuit design, including the low level presets, may be specified as configuration data or a configuration bitstream. The system may load the circuit design inclusive of the low level presets within the SOC, thereby configuring the user specified circuit blocks for operation.

In another example, the system may store the low level presets within a circuit design and store the circuit design within memory elements, e.g., within local memory and/or a bulk storage device, of the system. In still another example, the processor system configuration, e.g., the low level presets, may be stored within memory elements of the system for subsequent recall and/or use including use and/or inclusion in other circuit designs.

Figure 5:
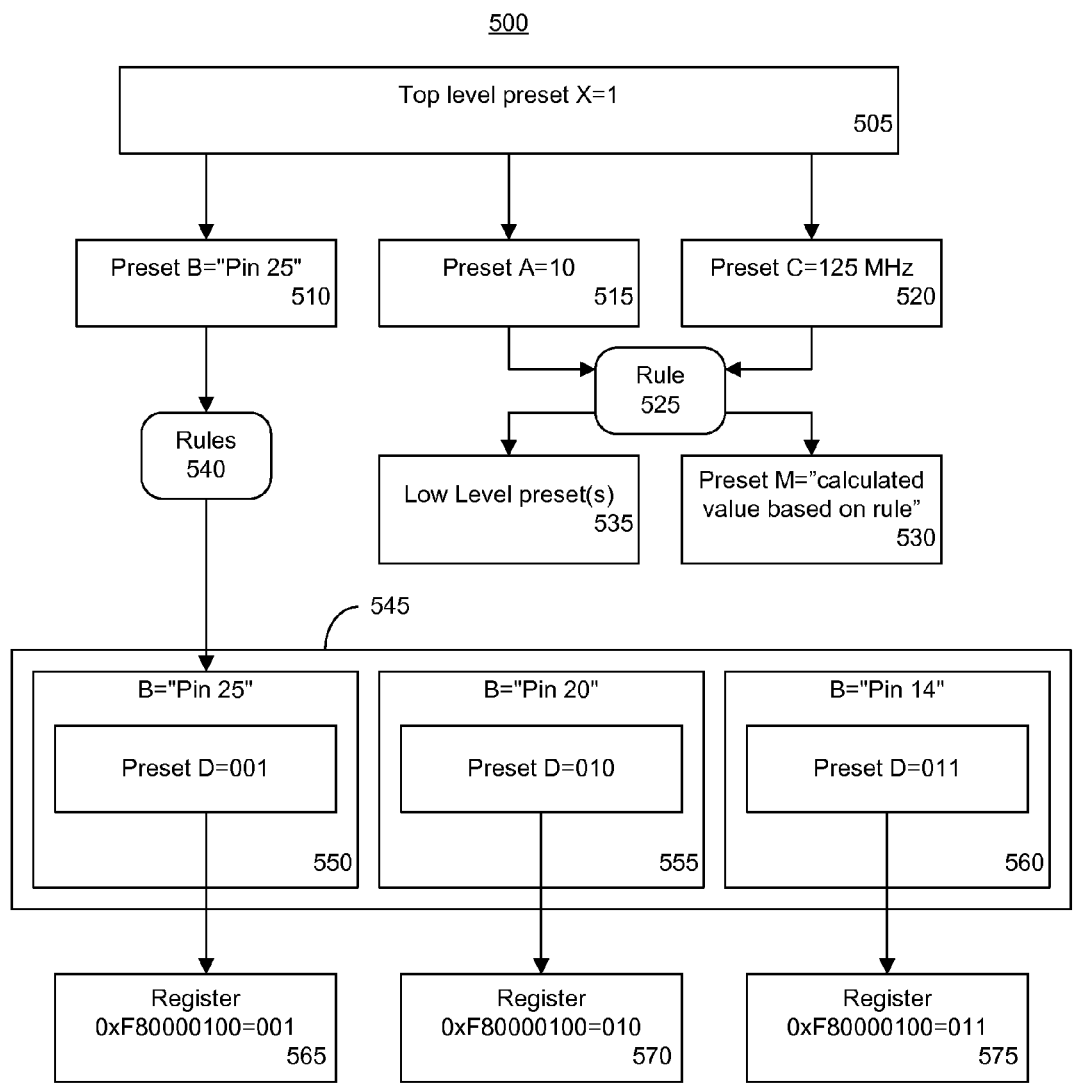
FIG. 5 is a block diagram illustrating a portion of an exemplary preset hierarchy.

FIG. 5 is a block diagram illustrating a portion of an exemplary preset hierarchy 500. In the example of FIG. 5, the user provides an initial input, from which the system determines a top level preset 505. In this example, top level preset 505 has a plurality of intermediate presets that are predetermined as child presets. As pictured, the predetermined intermediate presets for top level preset 505 are intermediate presets 510, 515, and 520. Intermediate presets 510, 515, and 520 may be referred to as "child intermediate presets" with top level preset 505 being the parent.

Both intermediate presets 515 and 520 are associated with a rule 525. In the example of FIG. 5, rule 525 may state that any time preset A and/or preset C, corresponding to intermediate presets 515 and 520, change, rule 525 is triggered and, as such, evaluated, or executed, anew by the system. It should be appreciated that rule 525 may be associated with one or more other intermediate and/or top level presets. For example, rule 525, as with any other rule of the preset data, may be implemented as a module or a generic module that may be invoked from one or more other nodes in preset hierarchy 500 or from one or more other nodes in other preset hierarchies. In any case, rule 525 receives preset A and preset C as inputs. Execution of rule 525 generates an output specifying "preset M," which is used to select intermediate preset 530. Intermediate present 530 is a child of intermediate presets 515 and 520. Rule 525 further may specify one or more other low level SOC settings as illustrated in low level preset 535. Low level preset 535 is also a child of intermediate presets 515 and 520. Intermediate presets 515 and 520 are parents of intermediate preset 530 and low level preset 535.

In one aspect, a rule, which may be associated with one or more presets in a hierarchy or hierarchies, specifies one or more particular nodes at a next, deeper level of the hierarchy being traversed, e.g., a child preset. The rule further may specify a value or values for the next level nodes specified. The value(s) of the rule may be determined from the particular preset and/or preset value with which the rule is associated that is the parent node to the next level nodes indicated by the rule.

Intermediate preset 510 also may be associated with one or more rules 540. In the example shown, rules 540 receive preset B as input and determines the next level intermediate preset based upon the value of preset B. For purposes of illustration, the system may traverse from intermediate preset 510 to any of the intermediate presets within group 545 of intermediate presets formed of intermediate presets 550, 555, and 560. Intermediate preset 510 is a parent to child intermediate presets 550, 555, and 560. Rule 540 illustrates the case where the system determines a child intermediate preset, i.e., intermediate preset 550, from a plurality of candidate child intermediate presets of the parent intermediate preset according to execution of a rule associated with the parent intermediate preset.

For example, when preset B is equal to "Pin 25," rule 540 indicates that the output is preset D with a value of "001." Accordingly, the system traverses to intermediate preset 550. If the value of preset B is "Pin 20," then the system traverses to intermediate preset 555, where the value of preset D is set to "010." If the value of preset B is "Pin 14," then the system traverse to intermediate preset 560, where the value of preset D is set to "011." Each of intermediate presets 550, 555, and 560 is associated with a low level preset. For example, intermediate preset 550 is associated with low level preset 565 specifying a particular register setting. Intermediate preset 555 is associated with low level preset 570 specifying a particular and different register setting. Finally, intermediate preset 560 is associated with low level preset 575 specifying yet another different register setting.

Accordingly, given an initial user input, the system is able to traverse preset hierarchy 500. After moving from top level setting 505 to intermediate presets 510, 515, and 520 having predetermined values, the system must determine and/or lookup values for the next level intermediate presets and iterate by applying associated rules for nodes traversed in the hierarchy until a low level preset is reached in each path that the system takes through preset hierarchy 500.

Figure 6:
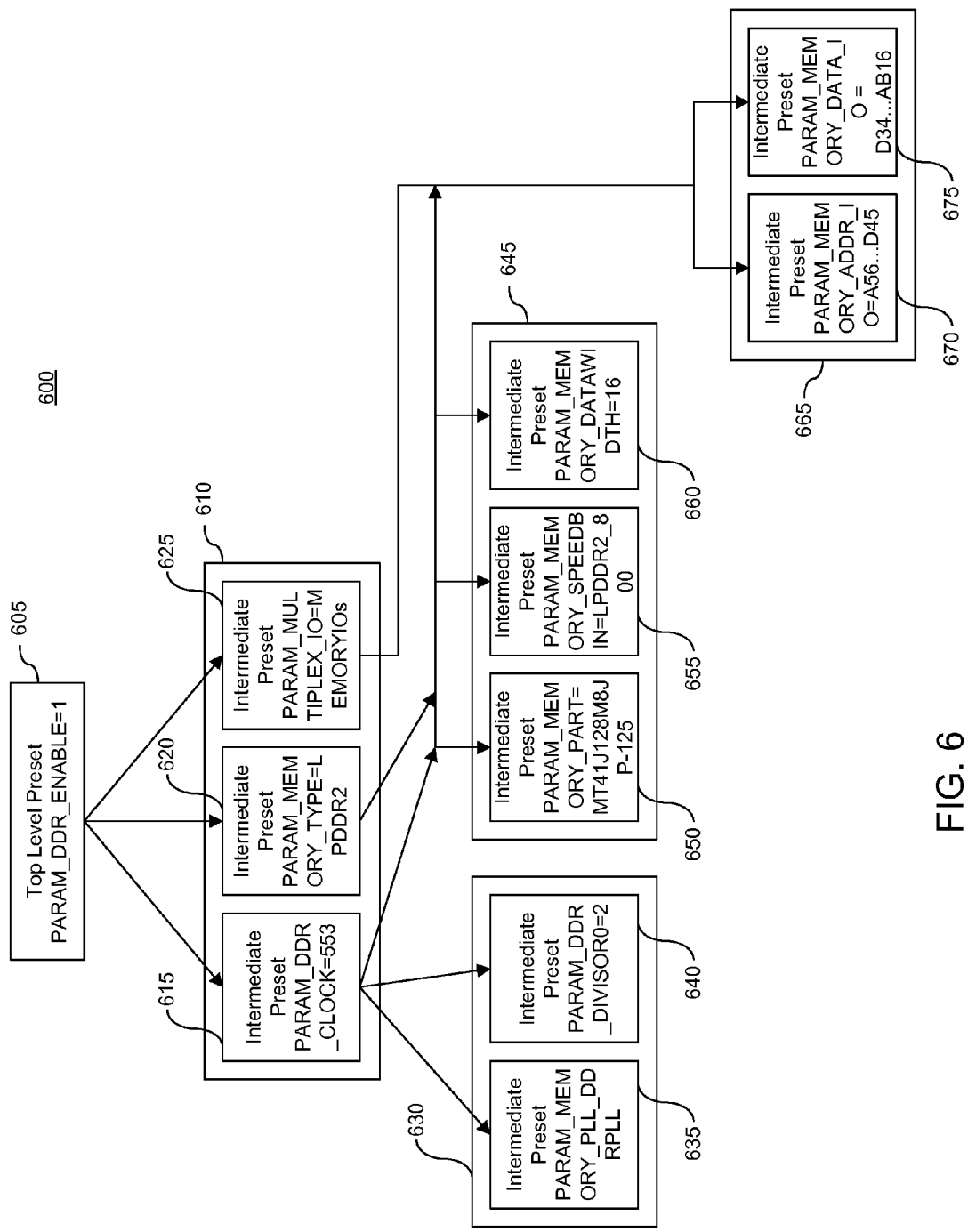
FIG. 6 is a block diagram illustrating a portion of another exemplary preset hierarchy.

FIG. 6 is a block diagram illustrating a portion of an exemplary preset hierarchy 600. FIG. 6 illustrates the series of presets selected from the hierarchy responsive to a user selection of a particular feature that is desired for inclusion in a circuit design. In this example, the system selects a top level preset 605 responsive to receipt of a user input selecting "DDR" functionality.

Top level preset 605 is associated with memory presets 610. Memory presets 610 include intermediate presets 615, 620, and 625. Intermediate preset 615 indicates a clock frequency of 553 MHz. Intermediate preset 620 indicates a memory type of "LPDDR2". Intermediate preset 625 indicates a multiplexer I/O preset of "Memory IOs," which may be further elaborated in the next level intermediate presets.

Intermediate preset 615 is linked with clock presets 630. Clock presets 630 include intermediate presets 635 and 640. Intermediate preset 635 specifies a PLL preset corresponding to "DDR." Intermediate preset 640 specifies a divisor present for the PLL for the clock.

Both intermediate presets 615 and 620 are linked with memory part presets 645. Memory part presets 645 include intermediate presets 650, 655, and 660. Intermediate preset 650 specifies a particular part number of the DDR memory that is to be used. Intermediate preset 655 specifies a speed of the LPDDR2 memory that is to be used. Intermediate preset 660 specifies a data width of the particular memory that is to be used.

Each of presets 615, 620, and 625 is also linked with multiplexer IO presets 665. Multiplexer 10 presets 665 includes intermediate preset 670 and intermediate preset 675. Intermediate preset 670 specifies that I/O addresses A56 through D45 are to be used by the memory controller in communicating with the DDR memory. Preset 675 specifies that addresses D34 through AB16 are also to be used.

For purposes of illustration, each of intermediate presets 635, 640, 650, 655, 660, 670, and 675 may be linked with a low level preset (not shown). The low level preset may be a leaf child node of each of the aforementioned intermediate presets. Each low level present may specify one or more values, e.g., bits, that may be loaded into control registers of the processor system to implement the user requested functionality, which is the inclusion of DDR memory in this case. The values specified by the low level presets configure the processor system for operation using DDR memory.

Figure 7:
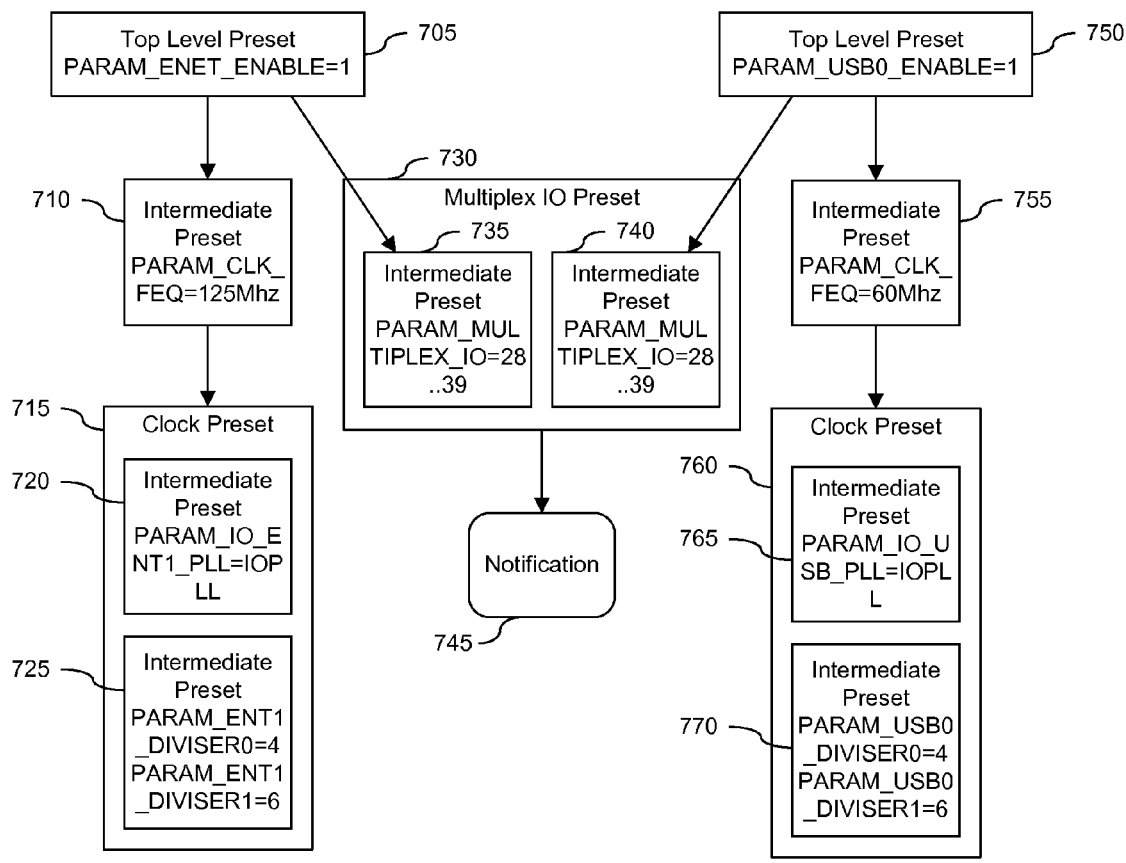
FIG. 7 is a block diagram illustrating a conflict between portions of two exemplary preset hierarchies.

FIG. 7 is a block diagram illustrating a conflict between portions of two exemplary preset hierarchies. FIG. 7 illustrates a portion of a first hierarchy for an Ethernet port having a top level preset of 705. FIG. 7 further illustrates a portion of a second hierarchy for a USB port having a top level preset of 750. In this example, the user has provided user inputs to enable the Ethernet port and the USB0 port.

Referring to the first hierarchy, top level preset 705 is associated with intermediate preset 710. Intermediate preset 710, which defines the clock frequency for the Ethernet port, is associated with clock presets 715. Clock presets 715 include an intermediate preset 720 defining a PLL preset for the clock and intermediate preset 725 defining divisor presets for the PLL for the clock.

Referring to the second hierarchy, top level preset 750 is associated with intermediate preset 755. Intermediate preset 755, which defines the clock frequency for the USB0 port, is associated with clock presets 760. Clock presets 760 include an intermediate preset 765 defining a PLL preset for the clock and intermediate preset 770 defining divisor presets for the PLL for the clock.

Each of top level presets 705 and 750 is associated with multiplexer IO presets 730. More particularly, each of top level presets 705 and 750 is associated with an intermediate preset defining the same IOs. Top level preset 705 is associated with intermediate preset 735 indicating that the Ethernet port will utilize IOs 28 through 39. Top level preset 750 is associated with intermediate preset 740 indicating that USB0 port also will utilize IOs 28 through 39. Since the two ports may not utilize the same physical IOs of the IC, the system detects a conflict between top level presets 705 and 750 since both attempt to use the same intermediate preset with the same value. The system determines that intermediate preset 735 for the Ethernet port utilizes a same hardware resource of the SOC as intermediate preset 740 for the USB0 port. Accordingly, the system outputs a notification 745 of the conflict.

FIGS. 8-1 through 8-5, taken together, illustrate an example of a preset hierarchy 800 specified in eXtensible Markup Language (XML) format.

In accordance with the inventive arrangements disclosed herein, a user is guided through configuration of circuit blocks of a processor system of an SOC using one or more sets of hierarchically ordered presets. Responsive to a user input selecting a particular circuit block and/or feature of the processor system to be enabled, the system automatically selects a top level present and begins to traverse a preset hierarchy resulting in the determination of low level preset(s) that may be loaded into control registers of the processor system effectively implementing the user desired processor system configuration. By using a hierarchy and rules for determining paths through the hierarchy, a user may configure a processor system with significantly fewer inputs than is otherwise required. Further, conflicting settings among different subsystems of the processor system may be avoided.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

As defined herein, the term "automatically" means without user intervention. As defined herein, the term "user" means a human being. The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when," "upon," "in response to determining," "in response to detecting," "responsive to determining," or "responsive to detecting," depending on the context. Similarly, the phrase "if it is determined" or the phrase "if [a stated condition or event] is detected" may be construed to mean "upon determining," "in response to determining," "responsive to determining," "upon detecting [the stated condition or event]," "in response to detecting [the stated condition or event]," or "responsive to detecting [the stated condition or event]," depending on the context.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a computer-readable data storage medium. As defined herein, the term "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method includes receiving a user input selecting a first circuit block of an SOC for enablement, determining, using a processor, a first top level preset according to the user input for the first circuit block, and determining selected intermediate presets from a plurality of hierarchically ordered presets for the first circuit block. The method also includes automatically determining low level presets for the first circuit block according to the selected intermediate presets for the first circuit block, and outputting the low level presets.

Outputting the low level presets may comprise loading the low level presets into the SOC.

The method may also include detecting a conflict between at least one selected intermediate preset for the first circuit block and at least one selected intermediate preset for a second circuit block. Detecting the conflict may include determining that the at least one selected intermediate preset for the first circuit block utilizes a same hardware resource of the SOC as the at least one selected intermediate preset for the second circuit block. A notification that the first circuit block is not compatible with the second circuit block may be provided.

In one aspect, the first circuit block comprises a hardware resource within a processor system of the SOC.

In another aspect, the intermediate presets are associated with rules. Determining selected intermediate presets may include determining a child intermediate preset from a plurality of candidate child intermediate presets of a parent intermediate preset within the plurality of hierarchically ordered presets, according to execution of a rule associated with the parent intermediate preset.

A system includes a processor programmed to initiate executable operations. The executable operations include receiving a user input selecting a first circuit block of an SOC for enablement, determining a first top level preset according to the user input for the first circuit block, and determining selected intermediate presets from a plurality of hierarchically ordered presets for the first circuit block. The executable operations also include automatically determining low level presets for the first circuit block according to the selected intermediate presets for the first circuit block, and outputting the low level presets.

Outputting the low level presets may comprise loading the low level presets into the SOC.

The processor may also be programmed to initiate executable operations including detecting a conflict between at least one selected intermediate preset for the first circuit block and at least one selected intermediate preset for a second circuit block. Detecting the conflict may include determining that the at least one selected intermediate preset for the first circuit block utilizes a same hardware resource of the SOC as the at least one selected intermediate preset for the second circuit block. The processor may also be programmed to initiate executable operations including providing a notification that the first circuit block is not compatible with the second circuit block.

In one aspect, the first circuit block comprises a hardware resource within a processor system of the SOC.

In another aspect, the intermediate presets are associated with rules. Determining selected intermediate presets may include determining a child intermediate preset from a plurality of candidate child intermediate presets of a parent intermediate preset within the plurality of hierarchically ordered presets, according to execution of a rule associated with the parent intermediate preset.

A non-transitory computer-readable storage medium has instructions stored thereon which, when executed by a processor, perform a method. The method includes receiving a user input selecting a first circuit block of an SOC for enablement, determining, using the processor, a first top level preset according to the user input for the first circuit block, and determining selected intermediate presets from a plurality of hierarchically ordered presets for the first circuit block. The method further includes automatically determining low level presets for the first circuit block according to the selected intermediate presets for the first circuit block, and outputting the low level presets.

Outputting the low level presets may comprise loading the low level presets into the SOC.

The method may also include detecting a conflict between at least one selected intermediate preset for the first circuit block and at least one selected intermediate preset for a second circuit block. Detecting the conflict may include determining that the at least one selected intermediate preset for the first circuit block utilizes a same hardware resource of the system-on-chip as the at least one selected intermediate preset for the second circuit block. The method may include providing a notification that the first circuit block is not compatible with the second circuit block.

In one aspect, the intermediate presets are associated with rules. Determining selected intermediate presets may include determining a child intermediate preset from a plurality of candidate child intermediate presets of a parent intermediate preset within the plurality of hierarchically ordered presets, according to execution of a rule associated with the parent intermediate preset.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:
1. A method, comprising:
receiving a user input selecting a first circuit block of a system-on-chip for enablement;
determining, using a processor, a first top level preset according to the user input for the first circuit block;

determining selected intermediate presets from a plurality of hierarchically ordered presets for the first circuit block;

automatically determining low level presets for the first circuit block according to the selected intermediate presets for the first circuit block; and configuring the system-on-chip by loading control register values specified by the low level presets into a control register of a processor system of the system-on-chip.

2. The method of claim 1, further comprising:
detecting a conflict between at least one selected intermediate preset for the first circuit block and at least one selected intermediate preset for a second circuit block indicating that the first circuit block and the second circuit block are not compatible.

3. The method of claim 2, wherein detecting the conflict comprises:
determining that the at least one selected intermediate preset for the first circuit block utilizes a same hardware resource of the system-on-chip as the at least one selected intermediate preset for the second circuit block.

4. The method of claim 3, further comprising:
providing a notification that the first circuit block is not compatible with the second circuit block.

5. The method of claim 1, wherein the configuring the system-on-chip comprises:
including the control register values within a circuit design specified as a configuration bitstream provided to the system-on-chip.

6. The method of claim 1, wherein:
the intermediate presets are associated with rules; and
determining the selected intermediate presets comprises determining a child intermediate preset from a plurality of candidate child intermediate presets of a parent intermediate preset within the plurality of hierarchically ordered presets, according to execution of a rule associated with the parent intermediate preset.

7. A system, comprising:
a processor programmed to initiate executable operations comprising:
receiving a user input selecting a first circuit block of a system-on-chip for enablement;
determining a first top level preset according to the user input for the first circuit block;
determining selected intermediate presets from a plurality of hierarchically ordered presets for the first circuit block;
automatically determining low level presets for the first circuit block according to the selected intermediate presets for the first circuit block; and
configuring the system-on-chip by loading control register values specified by the low level presets into a control register of a processor system of the system-on-chip.

8. The system of claim 7, wherein the processor is further programmed to initiate executable operations comprising:
detecting a conflict between at least one selected intermediate preset for the first circuit block and at least one selected intermediate preset for a second circuit block indicating that the first circuit block and the second circuit block are not compatible.

9. The system of claim 8, wherein detecting the conflict comprises:
determining that the at least one selected intermediate preset for the first circuit block utilizes a same hardware resource of the system-on-chip as the at least one selected intermediate preset for the second circuit block.

10. The system of claim 9, wherein the processor is further programmed to initiate executable operations comprising:
providing a notification that the first circuit block is not compatible with the second circuit block.

11. The system of claim 7, wherein the configuring the system-on-chip comprises:
including the control register values within a circuit design specified as a configuration bitstream provided to the system-on-chip.

12. The system of claim 7, wherein:
the intermediate presets are associated with rules; and
determining the selected intermediate presets comprises determining a child intermediate preset from a plurality of candidate child intermediate presets of a parent intermediate preset within the plurality of hierarchically ordered presets, according to execution of a rule associated with the parent intermediate preset.

13. A non-transitory computer-readable storage medium having instructions stored thereon which, when executed by a processor, perform a method comprising:
receiving a user input selecting a first circuit block of a system-on-chip for enablement;
determining, using the processor, a first top level preset according to the user input for the first circuit block;
determining selected intermediate presets from a plurality of hierarchically ordered presets for the first circuit block;
automatically determining low level presets for the first circuit block according to the selected intermediate presets for the first circuit block; and
configuring the system-on-chip by loading control register values specified by the low level presets into a control register of a processor system of the system-on-chip.

14. The non-transitory computer-readable storage medium of claim 13, wherein the method further comprises:
detecting a conflict between at least one selected intermediate preset for the first circuit block and at least one selected intermediate preset for a second circuit block indicating that the first circuit block and the second circuit block are not compatible.

15. The non-transitory computer-readable storage medium of claim 14, wherein detecting the conflict comprises:
determining that the at least one selected intermediate preset for the first circuit block utilizes a same hardware resource of the system-on-chip as the at least one selected intermediate preset for the second circuit block.

16. The non-transitory computer-readable storage medium of claim 15, wherein the method further comprises:
providing a notification that the first circuit block is not compatible with the second circuit block.

17. The non-transitory computer-readable storage medium of claim 13, wherein:
the intermediate presets are associated with rules; and
determining the selected intermediate presets comprises determining a child intermediate preset from a plurality of candidate child intermediate presets of a parent intermediate preset within the plurality of hierarchically ordered presets, according to execution of a rule associated with the parent intermediate preset.

* * * * *